(12) United States Patent
Endo et al.

(10) Patent No.: US 8,553,080 B2
(45) Date of Patent: Oct. 8, 2013

(54) COMPONENT PLACEMENT APPARATUS

(75) Inventors: Tadashi Endo, Fukuoka (JP); Akira Noudo, Fukuoka (JP); Kazuhide Nagao, Fukuoka (JP)

(73) Assignee: Panasonic Corporation, Osaka (JP)

( * ) Notice: Subject to any disclaimer, the term of this patent is extended or adjusted under 35 U.S.C. 154(b) by 792 days.

(21) Appl. No.: 12/668,102

(22) PCT Filed: Aug. 27, 2008

(86) PCT No.: PCT/JP2008/065785
§ 371 (c)(1),
(2), (4) Date: Jan. 13, 2010

(87) PCT Pub. No.: WO2009/028713
PCT Pub. Date: Mar. 5, 2009

(65) Prior Publication Data
US 2010/0321487 A1 Dec. 23, 2010

(30) Foreign Application Priority Data

| Aug. 28, 2007 | (JP) | P2007-220558 |
| Aug. 28, 2007 | (JP) | P2007-220559 |
| Aug. 28, 2007 | (JP) | P2007-220560 |

(51) Int. Cl.
*H04N 7/18* (2006.01)
(52) U.S. Cl.
USPC .............................. 348/87; 29/833
(58) Field of Classification Search
USPC .............................. 348/87; 29/833
See application file for complete search history.

(56) References Cited

U.S. PATENT DOCUMENTS

| 6,144,452 A * | 11/2000 | Hachiya | 356/615 |
| 6,222,629 B1 * | 4/2001 | Morris | 356/601 |
| 2007/0074390 A1 * | 4/2007 | Ota et al. | 29/833 |

FOREIGN PATENT DOCUMENTS

| CN | 1728935 A | 2/2006 |
| CN | 1788533 A | 6/2006 |

(Continued)

OTHER PUBLICATIONS

International Search Report for PCT/JP2008/065785.

(Continued)

*Primary Examiner* — Christopher S Kelley
*Assistant Examiner* — Mohammed Jebari
(74) *Attorney, Agent, or Firm* — Pearne & Gordon LLP

(57) ABSTRACT

To provide a component placement apparatus capable of preventing free operation of a mounting head within the movable region from being restricted as well as improving the mounting takt time.
A component placement apparatus 1 comprising a line sensor camera 23 composed of a projector 21 for projecting inspection light in horizontal direction and a line sensor 22 for receiving the inspection light projected by the projector 21, the component placement apparatus 1 designed to move a mounting head 7 to allow a component P sucked to the suction nozzle 9 of the mounting head 7 before being mounted onto a substrate 10 to horizontally cross the optical axis 20 of the inspection light of the line sensor camera 23 to cause the line sensor camera 23 to perform imaging of the component and to determine the propriety of suction attitude of the component P with respect to the suction nozzle 9 based on the image DP of the component P obtained through imaging of the component P by the line sensor camera 23, characterized in that the projector 21 and the line sensor 22 constituting the line sensor camera 23 are arranged outside the movable region R of the mounting head 7 with respect to the base 2.

11 Claims, 11 Drawing Sheets

(56) References Cited

FOREIGN PATENT DOCUMENTS

| | | |
|---|---|---|
| EP | 0 915 644 A1 | 5/1999 |
| EP | 0915644 A1 | 5/1999 |
| JP | 61-193008 A | 8/1986 |
| JP | 06-216584 A | 8/1994 |
| JP | 2000-278000 A | 10/2000 |
| JP | 2004-356139 A | 12/2004 |
| JP | 2007-123807 A | 5/2007 |
| JP | 2008-311336 A | 12/2008 |
| WO | 00/78116 A1 | 12/2000 |
| WO | 2007/033349 A1 | 3/2007 |

OTHER PUBLICATIONS

Chinese Office Action dated Jun. 15, 2011.

\* cited by examiner

COMPONENT PLACEMENT APPARATUS

TECHNICAL FIELD

The present invention relates to a component placement apparatus for moving a mounting head with respect to a base and mounting onto a substrate positioned on the base a component sucked (picked up) to a suction nozzle of the mounting head.

BACKGROUND ART

A component placement apparatus includes suction nozzles on a mounting head that is movable with respect to a base and is designed to suck (pick up) to a suction nozzle a component supplied from a component supply part and mount the component onto a substrate positioned on a base. A component picked up at a suction nozzle is moved so as to pass over a component camera mounted on a base before being mounted onto the substrate followed by image recognition (imaging) of the component by the component camera. From the image information obtained, a deviation (suction deviation) of the component in the direction around the vertical axis of the suction nozzle or the like is detected. Such deviation information is used to calculate a positional deviation correction amount used when a component is mounted onto a substrate.

A component sucked to a suction nozzle undergoes image recognition (imaging) by a line sensor camera arranged close to a component camera in the process of image recognition of the component by the component camera. The propriety of suction attitude of a component with respect to the suction nozzle is determined based on an image obtained. A projector and a line sensor constituting a line sensor camera are arranged so that the optical axis of the inspection light will be orthogonal to (or almost orthogonal to) the moving direction of a component in plan view. A component sucked to a suction nozzle is imaged by a line sensor camera when crossing the optical axis of the inspection light. The height (dimension in the height direction) of the image of the component is obtained from the resulting image. In case the height is above a predetermined reference value (preset considering the thickness of the component and a tolerance), the component is likely to be sucked to the suction nozzle in a tilted attitude. It is thus determined that the suction attitude of the component with respect to the suction nozzle is nonconforming and the component is discarded without being mounted onto a substrate (Patent Reference 1).

[Patent Reference 1] JP-A-2004-356139

Technical Problem

In case a line sensor camera (a projector and a line sensor) is arranged near a component camera, a mounting head is likely to interfere with the line sensor camera. Free operation of the mounting head in the movable region is restricted in order to avoid this problem, thus causing an increase in the mounting takt time.

Assume a case where a component is sucked to a suction nozzle in a tilted attitude. When the component is partially engaged into the suction nozzle, the height of the image of the component is the same as a reference value, so that it is difficult to determine the propriety of suction attitude based on the height of the image of the component. In particular, when a very small component is used, the ratio of the dimension tolerance of the component to the reference value is relatively large, which makes the determination more difficult.

When a very small component is used, the time required for a component to cross the inspection light of a line sensor becomes shorter. Thus, the number of measurements of images of a component obtained with a line sensor camera is reduced as a whole and it is difficult to accurately determine the external shape of the component thus possibly reducing the accuracy of determination of the propriety of suction attitude. In order to increase the number of measurements of images of a component obtained with a line sensor camera, the moving speed of a component (moving speed of a mounting head) crossing the inspection light should be reduced. This time, a new problem of an increase in the mounting takt time occurs.

DISCLOSURE OF THE INVENTION

An object of the invention is to provide a component placement apparatus capable of improving the mounting takt time without free movement of a mounting head in the movable region being restricted.

Another object of the invention is to provide a component placement apparatus capable of accurately determining the propriety of suction attitude of a very small component with respect to a suction nozzle.

Another object of the invention is to provide a component placement apparatus capable of accurately determining the propriety of suction attitude of a component with respect to a suction nozzle without increasing the mounting takt time.

Technical Solution

The invention provides a component placement apparatus for moving a mounting head with respect to a base and mounting onto a substrate positioned on the base a component sucked to a suction nozzle of the mounting head, the component placement apparatus comprising: a line sensor camera composed of a projector for projecting inspection light in horizontal direction and a line sensor for receiving the inspection light projected by the projector; imaging control means for moving the mounting head to allow a component sucked to the suction nozzle of the mounting head before being mounted onto the substrate to horizontally cross the optical axis of the inspection light of the line sensor camera to cause the line sensor camera to perform imaging of the component; and determination means for determining the propriety of suction attitude of the component with respect to the suction nozzle based on the image of the component obtained through imaging of the component by the line sensor camera; in that the projector and the line sensor constituting the line sensor camera are arranged outside the movable region of the mounting head with respect to the base.

The invention provides a component placement apparatus for moving a mounting head with respect to a base and mounting onto a substrate positioned on the base a component sucked to a suction nozzle of the mounting head, the component placement apparatus comprising: a line sensor camera composed of a projector for projecting inspection light in horizontal direction and a line sensor for receiving the inspection light projected by the projector; imaging control means for moving the mounting head to allow a component sucked to the suction nozzle of the mounting head before being mounted onto the substrate to horizontally cross the optical axis of the inspection light of the line sensor camera to cause the line sensor camera to perform imaging of the component;

and determination means for determining whether the height of the image of the component is above a reference value and whether the lower edge of the image of the component includes a tilted portion with respect to the level based on the image of the component obtained through imaging of the component by the line sensor camera and determining the propriety of suction attitude of the component with respect to the suction nozzle based on the result of the above determination.

The invention provides a component placement apparatus for moving a mounting head with respect to a base and mounting onto a substrate positioned on the base a component sucked to a suction nozzle of the mounting head, the component placement apparatus comprising: a line sensor camera composed of a projector for projecting inspection light in horizontal direction and a line sensor for receiving the inspection light projected by the projector; imaging control means for moving the mounting head to allow a component sucked to the suction nozzle of the mounting head before being mounted onto the substrate to horizontally cross the optical axis of the inspection light of the line sensor camera at an angle θ satisfying 0°<θ≤45° in plan view to cause the line sensor camera to perform imaging of the component; and determination means for determining the propriety of suction attitude of the component with respect to the suction nozzle based on the image of the component obtained through imaging of the component by the line sensor camera.

Advantageous Effects

In the component placement apparatus according to the invention, the projector and the line sensor constituting the line sensor camera are arranged outside the movable region of the mounting head with respect to the base. There is no danger of interference between the mounting head and the line sensor camera so that the mounting head is free to move within the movable region thus improving the mounting takt time.

A component placement apparatus according to the invention determines whether the height of the image of a component is above a reference value and whether the lower edge of the image of the component includes a tilted portion with respect to the level based on the image of a component obtained through imaging of the component by way of a line sensor camera. Then, the component placement apparatus determines the propriety of suction attitude of the component with respect to the suction nozzle based on the result of the above determination. This accurately detects a nonconforming suction attitude not detected only through comparison of the height of the image of the component with a reference value and accurately determines the propriety of suction attitude of a very small component as well.

A component placement apparatus according to the invention moves the mounting head to allow a component sucked to the suction nozzle of the mounting head before being mounted onto the substrate to cross the optical axis of the inspection light of the line sensor camera at an angle θ satisfying 0°<θ≤45° in plan view to perform imaging of the component. Thus, it is possible to relatively reduce the moving speed of a component viewed from the line sensor compared with related art practices where a component crosses the optical axis of inspection light in orthogonal (or almost orthogonal) direction in plan view. It is thus possible to increase the number of measurements of images of a component obtained by way of a line sensor thus accurately determining the outer shape of the component. With the invention, it is possible to accurately determine the propriety of suction attitude of the component with respect to the suction nozzle while reducing the moving speed of the mounting head and without increasing the mounting takt time.

BEST MODE FOR CARRYING OUT THE INVENTION

Figure 1:
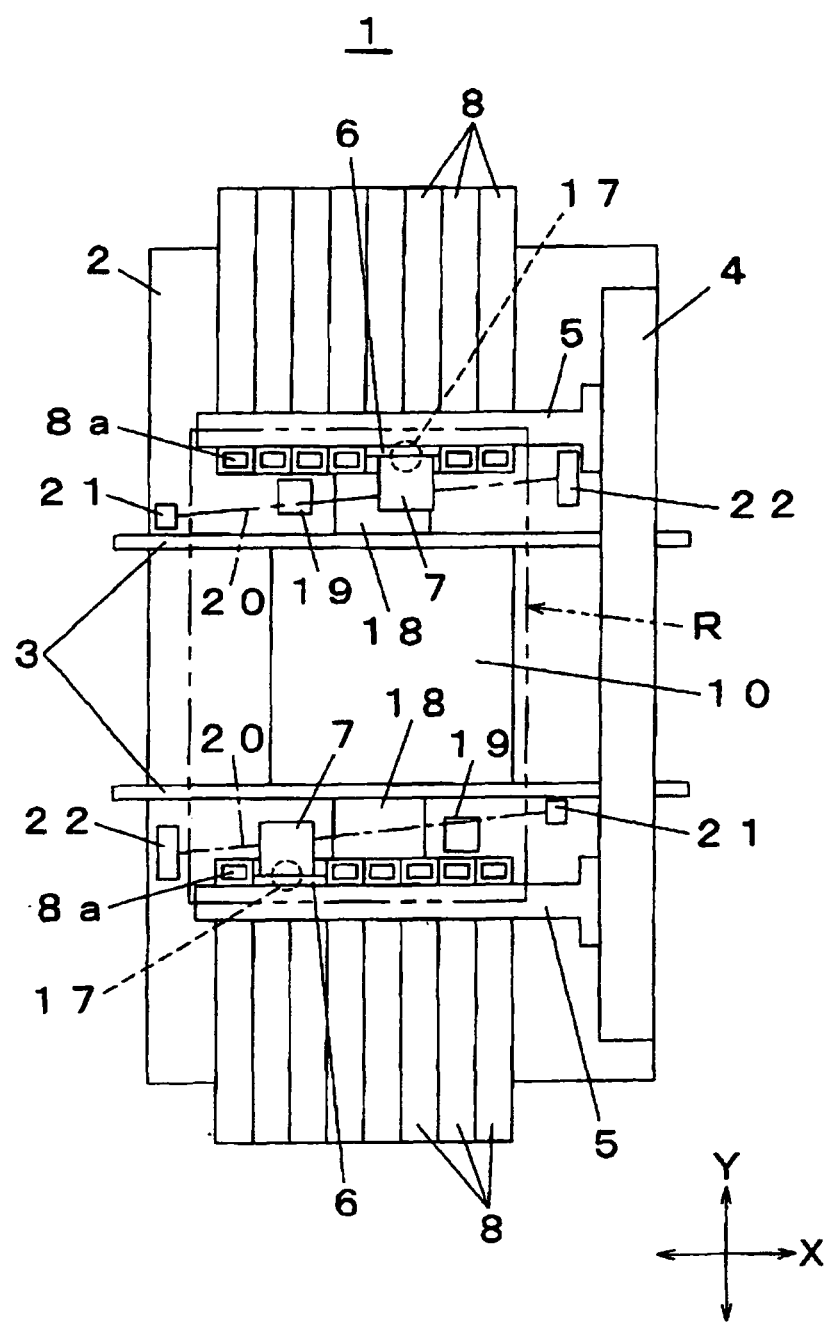
FIG. 1 is a plan view of a component placement apparatus according to an embodiment of the invention.
Figure 2:
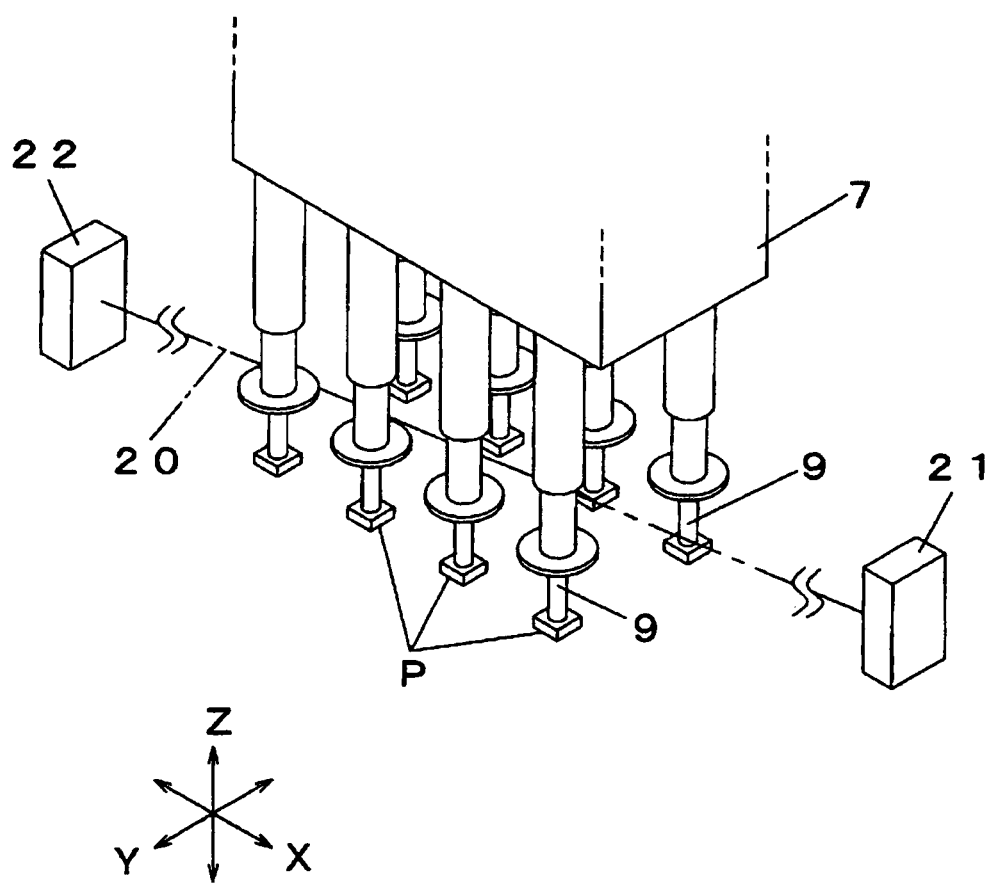
FIG. 2 is a perspective view of a mounting head and a line sensor camera according to an embodiment of the invention.
Figure 3:
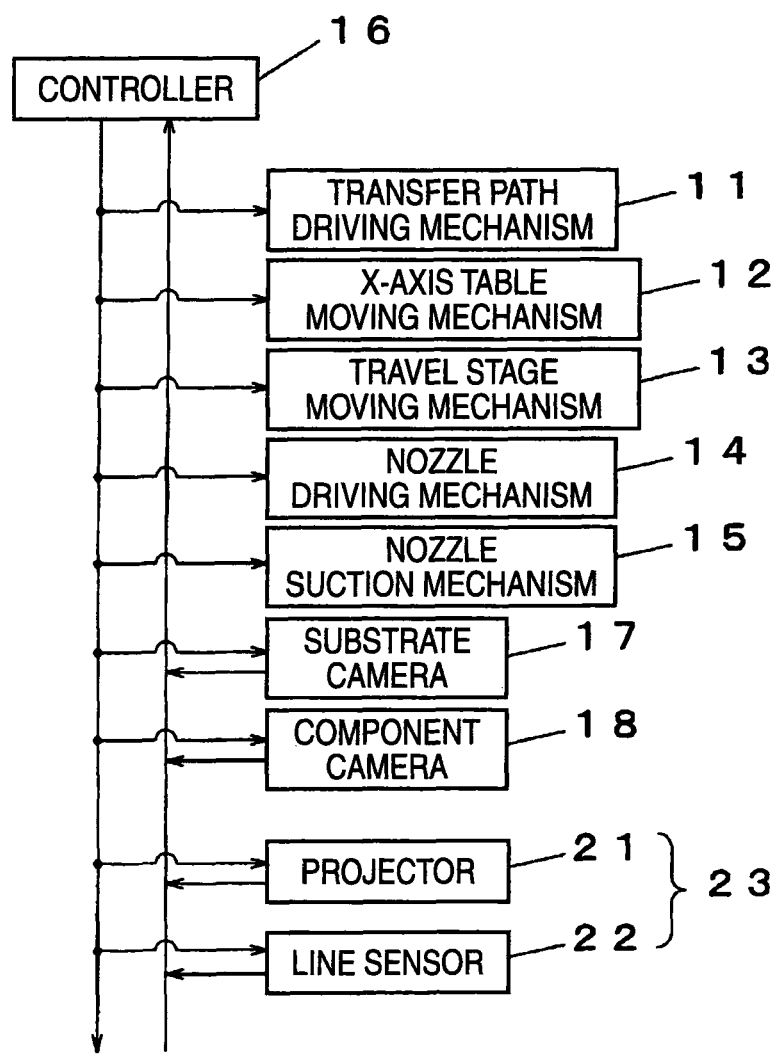
FIG. 3 is a block diagram of the control system of a component placement apparatus according to an embodiment of the invention.
Figure 4:
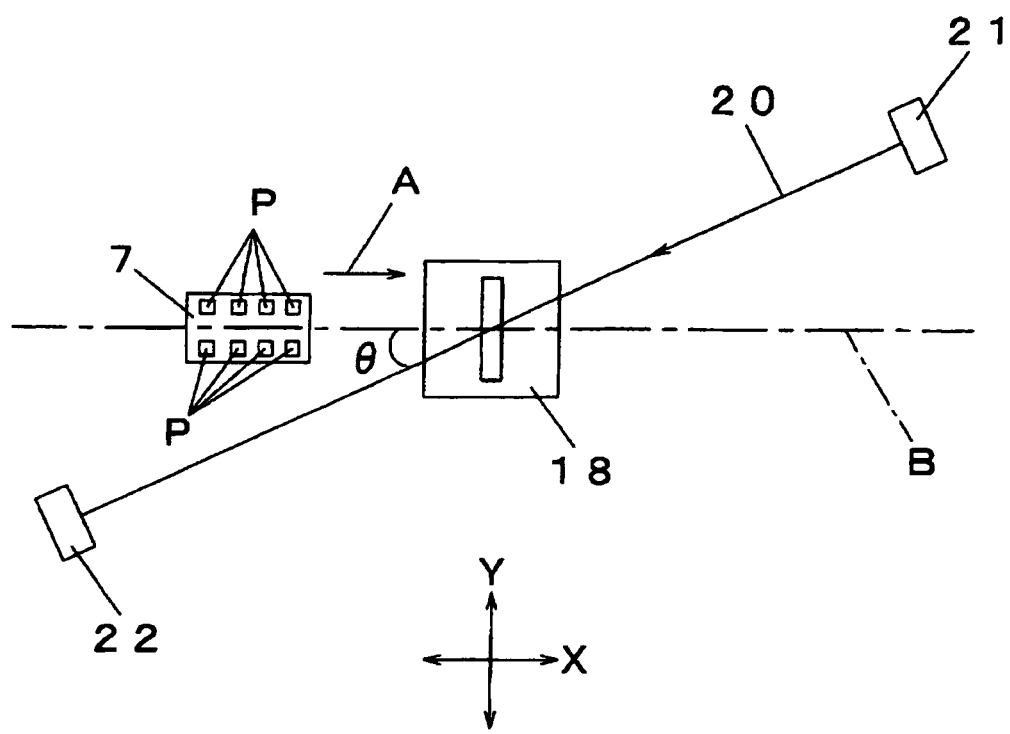
FIG. 4 shows the relationship between the optical axis of the inspection light of a line sensor camera and the travel orbit of a mounting head according to an embodiment of the invention.
Figure 5:
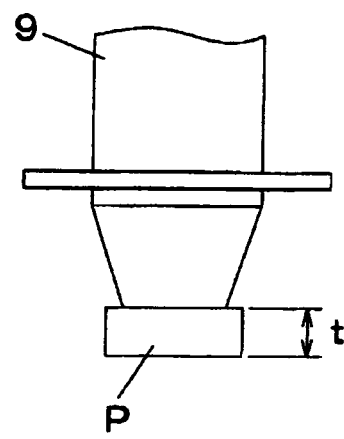
FIG. 5(a) to FIG. 5(d) each shows an example of suction attitude of a component sucked to a suction nozzle according to an embodiment of the invention.
Figure 5:
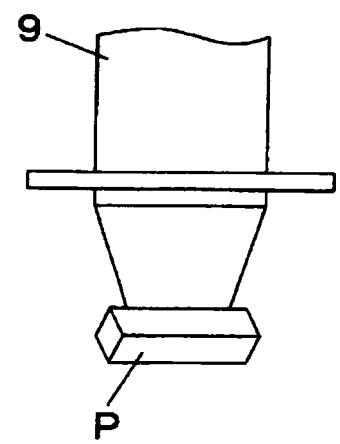
Figure 5:
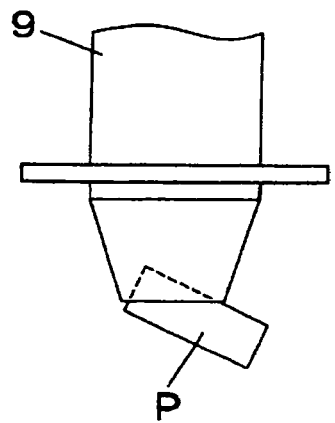
Figure 5:
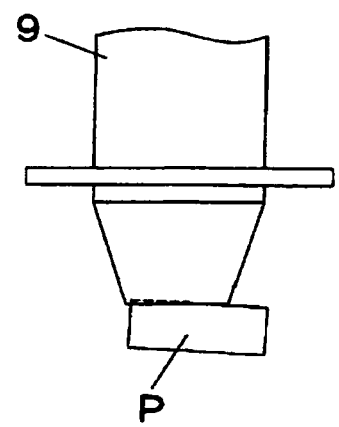
Figure 6:
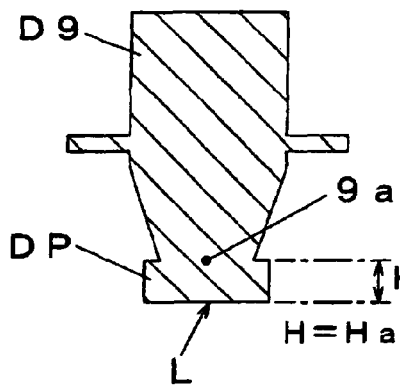
FIG. 6(a) to FIG. 6(d) each shows an example of the image of a component obtained by way of a line sensor according to an embodiment of the invention.
Figure 6:
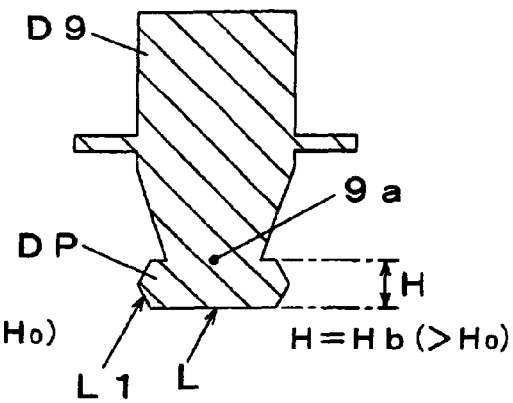
Figure 6:
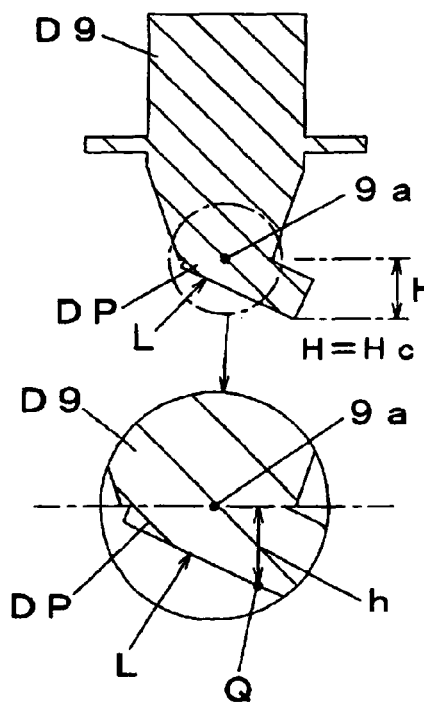
Figure 6:
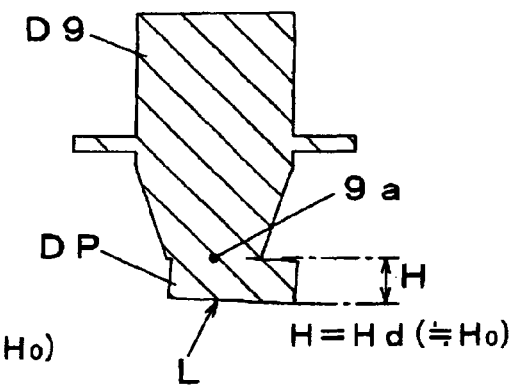
Figure 7:
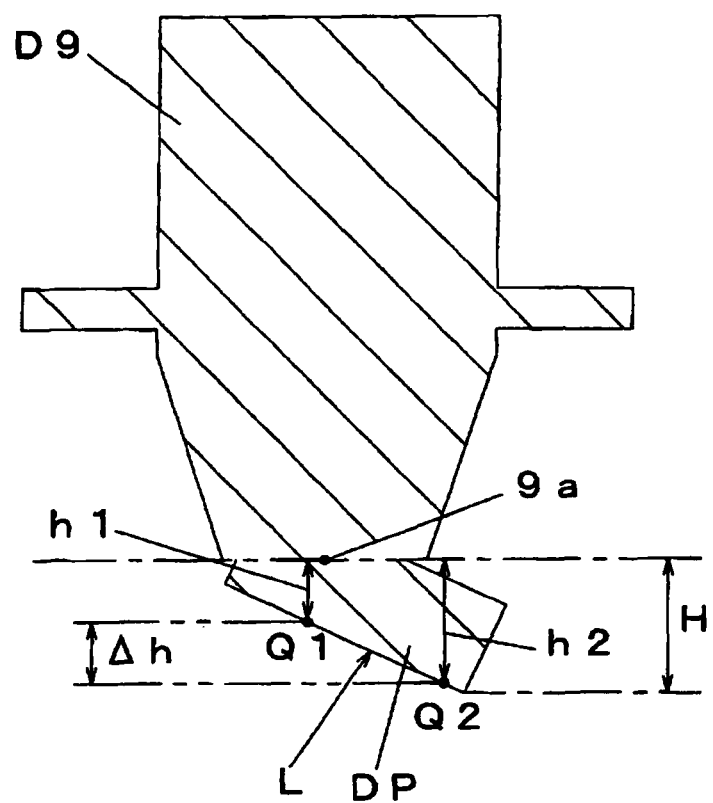
FIG. 7 shows an example of the image of a component obtained by way of a line sensor according to an embodiment of the invention.
Figure 8:
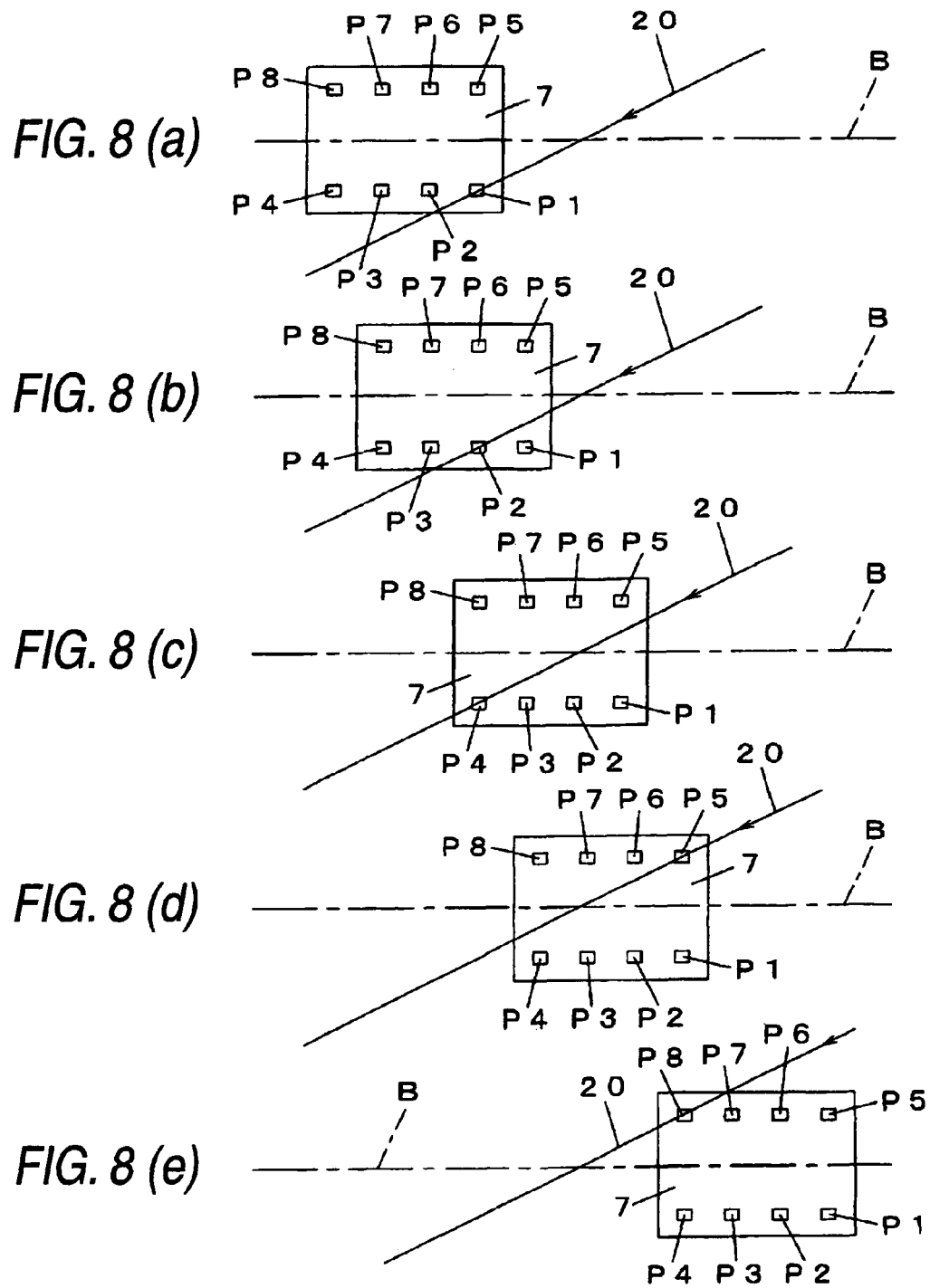
FIG. 8(a) to FIG. 8(e) each shows a component imaged by a line sensor during an orderly imaging process according to an embodiment of the invention.
Figure 9:
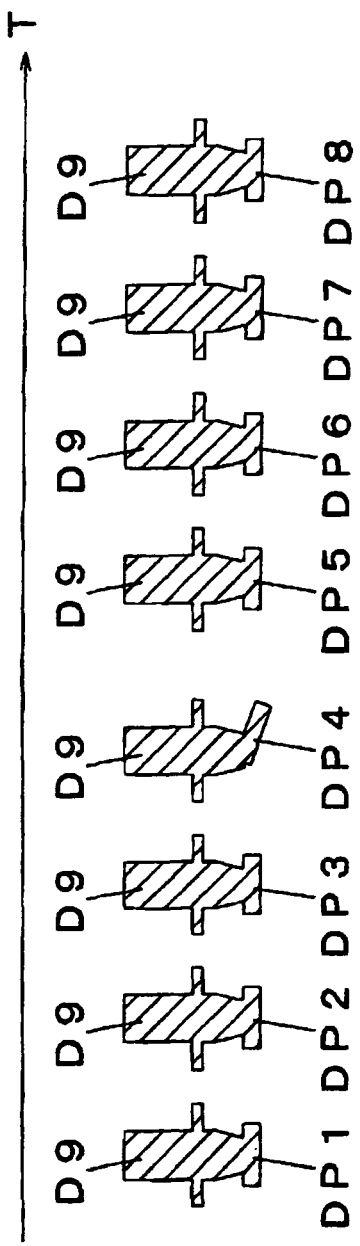
FIG. 9 shows an example of the images of a plurality of components obtained by way of a line sensor camera according to an embodiment of the invention.
Figure 10:
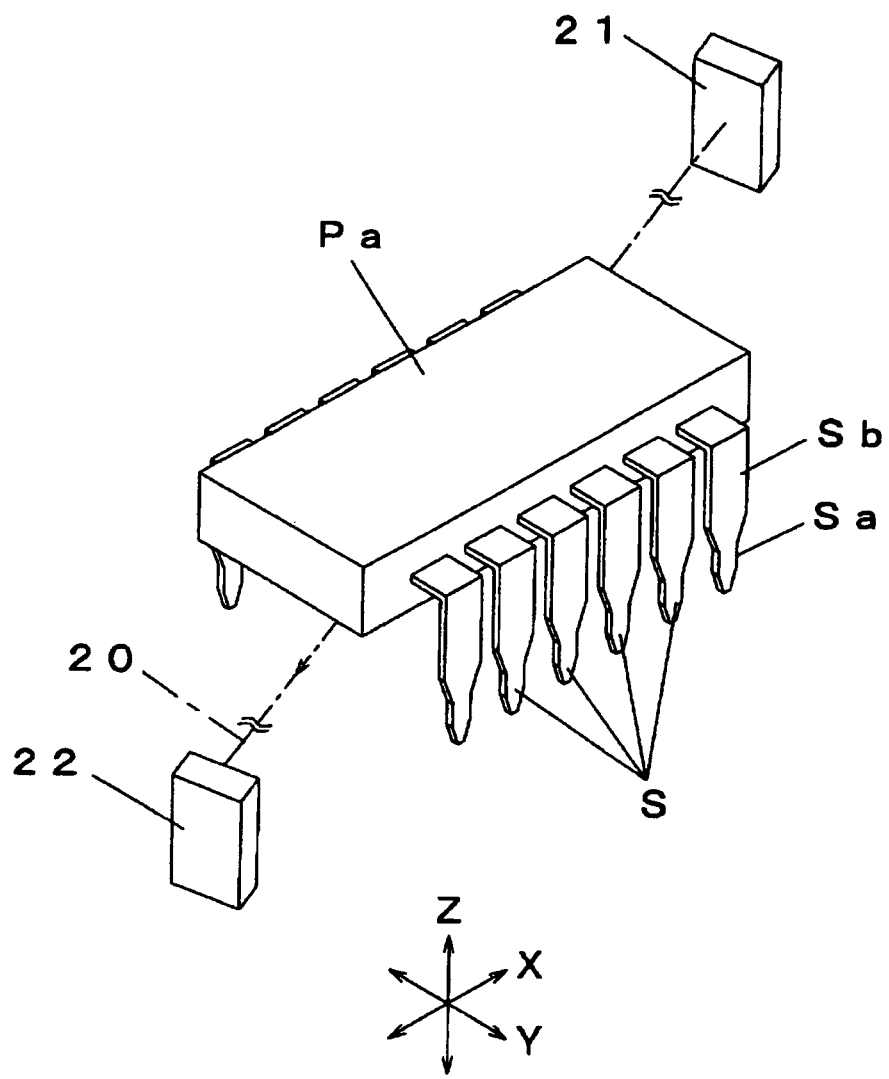
FIG. 10 is a perspective view of an insertion mounting component according to an embodiment of the invention.
Figure 11:
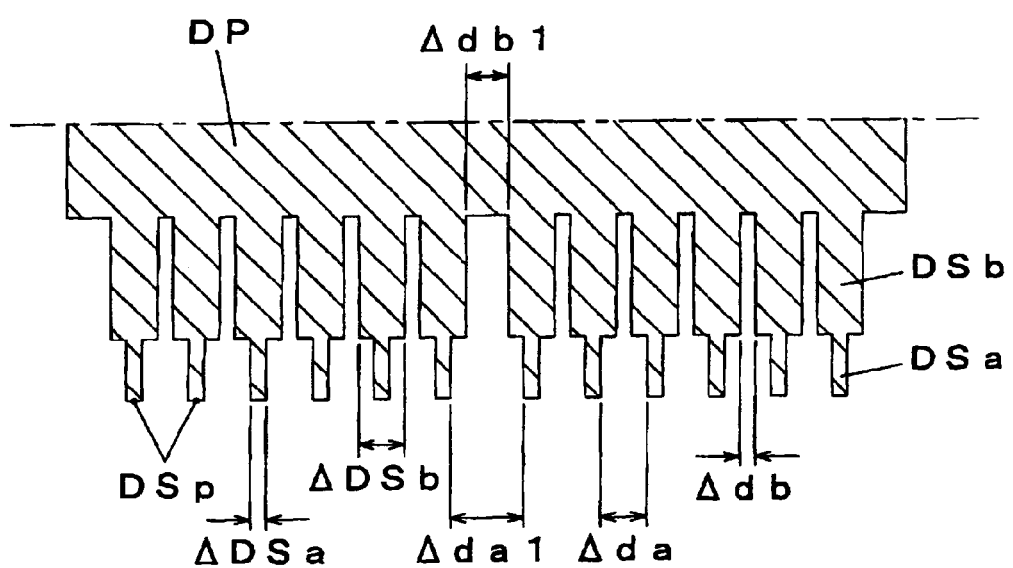
FIG. 11 shows an example of the image of an insertion mounting component obtained by way of a line sensor camera according to an embodiment of the invention.

An embodiment of the invention will be described referring to figures. FIG. 1 is a plan view of a component placement apparatus according to an embodiment of the invention. FIG. 2 is a perspective view of a mounting head and a line sensor camera according to an embodiment of the invention. FIG. 3 is a block diagram of the control system of a component placement apparatus according to an embodiment of the invention. FIG. 4 shows the relationship between the optical axis of the inspection light of a line sensor camera and the travel orbit of a mounting head according to an embodiment of the invention. FIGS. 5(a), (b), (c), (d) each shows an example of suction attitude of a component sucked to a suction nozzle according to an embodiment of the invention. FIGS. 6(a), (b), (c), (d) each shows an example of the image of a component obtained by way of a line sensor according to an embodiment of the invention. FIG. 7 shows an example of the image of a component obtained by way of a line sensor according to an embodiment of the invention. FIGS. 8(a), (b), (c), (d), (e) each shows a component imaged by a line sensor during an orderly imaging process according to an embodiment of the invention. FIG. 9 shows an example of the images of a plurality of components obtained by way of a line sensor camera according to an embodiment of the invention. FIG. 10 is a perspective view of an insertion mounting component according to an embodiment of the invention. FIG. 11 shows an example of the image of an insertion mounting component obtained by way of a line sensor camera according to an embodiment of the invention.

In FIG. 1, a component placement apparatus 1 includes a substrate transfer path 3 extending in one direction (X-axis direction) in a level plane on a base 2. Above the substrate transfer path 3 is provided a Y-axis table 4 extending in a direction (Y-direction) orthogonal to the X-axis direction in the level plane. The Y-axis table 4 has two X-axis tables 5 extending in the X-axis direction whose one end is supported by the Y-axis table 4. Each X-table 5 has a travel stage 6 movable in the X-axis direction along the X-axis table 5. Each travel stage 6 includes a mounting head 7 mounted thereon. In the side region of the substrate transfer path 3 are arranged a plurality of parts feeders 8 as a component supply part side by side in the X-axis direction. Each parts feeder 8 positions a component supply port 8a in a movable region R of the mounting head 7 with respect to the base 2.

In FIG. 2, each mounting head 7 includes a plurality of suction nozzles 9 extending downward. The lower end of each suction nozzle 9 is designed to suck a component P supplied to the component supply port 8a of the parts feeder 8. In this embodiment, it is assumed that total eight suction nozzles 9 are arranged on the mounting head 7, four in the X-direction by two in the Y-direction.

In FIG. 3, the component placement apparatus 1 includes a transfer path driving mechanism 11 for driving the substrate transfer path 3, an X-axis table moving mechanism 12 for moving each X-axis table 5 along the Y-axis table 4, a travel stage moving mechanism 13 for moving each travel stage 6 along the X-axis table 5, a nozzle driving mechanism 14 for individually rotating each suction nozzle 9 around an elevation/vertical axis (Z-axis), and a nozzle suction mechanism 15 for causing each suction nozzle 9 to perform sucking operation. A controller 16 provided in the component placement apparatus 1 performs operation control of the transfer path driving mechanism 11 to perform transfer of a substrate 10 and positioning of the substrate 10 in a predetermined position on the base 2. The controller 16 also performs operation control of the X-axis table moving mechanism 12, the travel stage moving mechanism 13, the nozzle driving mechanism 14 and the nozzle suction mechanism 15 to perform operation control of the mounting head 7 including component mounting operation to mount onto the substrate 10 a component P picked up from the component supply port 8a of the parts feeder 8.

In FIG. 1, the mounting head 7 includes a substrate camera 17 with its imaging surface facing down. On the base 2 are arranged a component camera 18 with its imaging surface facing up and a line sensor camera 23 including a projector 21 for projecting inspection light in horizontal direction (projecting inspection light so that its optical axis 20 will be oriented in horizontal direction) and a line sensor 22 for receiving the inspection light projected by the projector 21. Operation of the substrate camera 17, the component camera 18 and the line sensor camera 23 (the projector 21 and the line sensor 22) is controller by the controller 16 (FIG. 3).

The controller 16 executes a pre-stored mounting program to perform control to mount a component P onto a substrate 10. Mounting of the component P onto the substrate 10 includes steps of operating the substrate transfer path 3, transferring/positioning a target substrate 10 in a predetermined position on the base 2, moving the mounting head 7 to a region above the substrate 10, and performing image recognition, by the substrate camera 17, of a positioning mark (not shown) provided in the corner of the substrate 10. The image information of the positioning mark recognized as an image by the substrate camera 17 is transmitted to the controller 16, which determines how far a positional deviation detecting mark is off the reference position based on the image information transmitted from the substrate camera 17 to detect a positional deviation of the substrate 10.

On detecting a positional deviation of the substrate 10, the controller 16 moves the mounting head 7 to a region above the parts feeder 8 and picks up (sucks), by the suction nozzle 9, a component P supplied to the component supply port 8a of the parts feeder 8. As shown in FIG. 4, the controller 16 moves the component P sucked to the suction nozzle 9 in a certain direction (in the direction of an arrow A shown in FIG. 4) on a horizontal travel orbit B parallel to the X-direction that passes above the component camera 18 (within the field view of the component camera 18) and causes the component camera 18 to perform image recognition (imaging) of the bottom surface of the component P. The image information of the bottom surface of each component P obtained through image recognition by the component camera 18 is transmitted to the controller 16 (FIG. 3). The controller 16 determines how far each component P is deviated from the suction nozzle 9 based on the image information transmitted from the component camera 18 and detects a deviation (suction deviation) of the component P from the suction nozzle 9.

As shown in FIG. 4, the projector 21 and the line sensor 22 constituting the line sensor camera 23 are arranged so that the optical axis 20 of the inspection light will cross the travel orbit B of the mounting head 7 at an angle θ satisfying $0°<θ≤45°$ in plan view. When the mounting head 7 moves on the travel orbit B, each component P sucked to the suction nozzle 9 of the mounting head 7 horizontally crosses the optical axis 20 of the inspection light of the line sensor camera 23 at an angle θ satisfying $0°<θ≤45°$ in plan view. The projector 21 and the line sensor 22 constituting the line sensor camera 23 are arranged outside the movable region R of the mounting head 7 with respect to the base 2 as shown in FIG. 1.

When each component P sucked to the suction nozzle 9 of the mounting head 7 horizontally crosses the inspection light of the line sensor camera 23 as the mounting head moves on the travel orbit B, the controller 16 causes the line sensor camera 23 to perform image recognition (imaging) of each component P from its side (in horizontal direction). The image information of each component P obtained through image recognition by the line sensor camera 23 (the image information of each component P obtained through image recognition by the line sensor camera 23 includes an image of part of the suction nozzle 9) is transmitted to the controller 16 (FIG. 3).

On detecting a positional deviation of the substrate 10 and a suction deviation of the component 9 as mentioned above, the controller 16 mounts the component P sucked to the suction nozzle 9 onto the substrate 10 based on the mounting position data given to the component P. The controller 16 corrects the mounting positional data at this time so as to correct the detected positional deviation of the substrate 10 and a positional deviation of the component P and mounts the component P in a correct position on the substrate 10.

The controller 16 determines the propriety of suction attitude of a component P with respect to the suction nozzle 9 based on the image information of each component P transmitted from the line sensor camera 23 before mounting the component P onto the substrate 10 as mentioned above. The controller 16 mounts a component P whose suction attitude is determined conforming onto the substrate 10. The controller 16 discards a component P whose suction attitude is determined nonconforming into a box-shaped component discarding part 19 arranged on the base 2 without mounting the component onto the substrate 10.

In this way, the controller 16 works in the component placement apparatus 1 according to this embodiment as imaging control means for moving the mounting head 7 to allow a component P sucked to the suction nozzle 9 of the mounting head 7 before being mounted onto the substrate 10 to horizontally cross the optical axis 20 of the inspection light of the line sensor camera 23 at an angle θ satisfying 0°<θ≤45° in plan view to cause the line sensor camera 23 to perform imaging of the component P and determination means for determining the propriety of suction attitude of the component P with respect to the suction nozzle 9 based on the image of the component P obtained through imaging of the component P by the line sensor camera 23. The procedure for determining the propriety of suction attitude of the component P by the controller 16 will be detailed.

As a suction attitude of the component P with respect to the suction nozzle 9, there may be a case where the component P is normally sucked without being tilted with respect to the level (the suction attitude is conforming) as shown in FIG. 5(a) and a case where the component P is not normally sucked while being tilted from the level (the suction attitude is nonconforming) as shown in FIG. 5(b), 5(c) or 5(d). Among the cases where the suction attitude is nonconforming is included a case where part of the component P is not engaged into the suction nozzle 9 as shown in FIG. 5(b) and a case where part of the component P is engaged into the suction nozzle 9 as shown in FIGS. 5(c) and 5(d). The suction states of the component P in FIGS. 5(a), 5(b), 5(c) and 5(d) are respectively captured in FIGS. 6(a), 6(b), 6(c) and 6(d) through image recognition (imaging) by the line sensor camera 23. In FIG. 6 (and in FIG. 7 described later), the image of the suction nozzle 9 is given a sign D9 and the image of the component P a sign DP.

The controller 16 determines, based on the image of a component P obtained through imaging by the line sensor camera 23, whether the height (dimension in height direction) H of the image DP of the component P (refer to FIGS. 6 and 7) is above a predetermined reference value H0 and whether the lower edge L of the image DP of the component P includes a tilted portion with respect to the level and determines the propriety of suction attitude of the component P based on the result of the above determination. Cases where the lower edge L of the image DP of the component P includes a tilted portion with respect to the level may be a case where the entirety of the lower edge L of the image DP is tilted from the level or a case where only part of the lower edge L of the image DP is tilted from the level.

The height H of the image DP of the component P refers to the maximum value of the distance h in vertical direction (refer to the partial exploded view in FIG. 6(c)) between a position 9a of the image DP of the component P corresponding to the lower end of the suction nozzle 9 and each point Q on the lower edge L of the image DP of the component P as shown in FIGS. 6(a), 6(b), 6(c) and 6(d). The height H can be obtained by comparing with each other the distances h in vertical direction for respective points Q on the lower edge L of the image DP of the component P. The reference value H0 is set by adding a tolerance to the thickness t of the component P shown in FIG. 5(a). In FIGS. 6(a), 6(b), 6(c) and 6(d), the heights H of the images DP of the component P are respectively Ha, Hb, Hc and Hd (where Ha≈H0, Hb>H0, Hc>H0, Hd≈H0).

In case the height H of the image DP of the component P is above the reference value H0, there is no chance of the component P normally sucked to the suction nozzle 9. Thus, the controller 16 determines that the suction attitude of the component P is nonconforming. In the case of FIG. 6(b) or 6(c), the controller 16 can detect that the suction attitude of the component is nonconforming only by determining whether the height H of the image DP of the component P is above the reference value H0.

In case the lower edge L of the image DP of the component P includes a tilted portion with respect to the level, there is no chance of the component P being normally sucked to the suction nozzle 9. Thus, the controller 16 determines that the suction attitude of the component P is nonconforming also. Presence of a tilted portion with respect to the level on the lower edge L of the image DP of the component P is detected, as shown in FIG. 7, by detecting that a difference Δh between distances in vertical direction h1, h2 measured for plural points Q1, Q2 on the lower edge L of the image DP of the component P exceeds a predetermined reference value (a conforming suction attitude indicates a difference Δh almost equal to 0), or that a difference between an average value of distances in vertical direction h measured for the points Q on the lower edge L and the height H of the image DP of the component P exceeds a predetermined reference amount (a conforming suction attitude indicates an average value of distances h almost equal to the height H) or the like. By using such a method, it is possible to detect that the suction attitude of the component P is nonconforming in the case of FIG. 6(c) or 6(d). The above processing may be made within a predetermined range around the vertical center axis of the suction nozzle 9 (for example within 10 lines sideways from the center axis of the suction nozzle 9) to boost the processing.

In this way, the component placement apparatus 1 according to this embodiment determines whether the height H of the image DP of a component P is above a predetermined reference value H0 and whether the lower edge L of the image DP of a component P includes a tilted portion with respect to the level based on the image of the component P obtained through imaging by the line sensor camera 23 and determines the propriety of suction attitude of the component P based on the result of the above determination. Assume a case where the nonconforming suction state of a component P is not detected by obtaining the height H of the image DP of the component P alone since the height H of the image DP of the component P is not above a reference value H0 (Hd≈H0) while the component P is tilted from the level and inadequately sucked to the suction nozzle 9 as in FIG. 6(d). In this case also, it is possible to detect a nonconforming suction state by determining whether the lower edge L of the image DP of the component P includes a tilted portion with respect to the level. Further, there may be a case in FIG. 6(b) where the height H of the image DP of the component P is not above the reference value H0 so that it is impossible to detect a nonconforming suction state of the component P only by obtaining the height H of the image DP of the component P, in particular, when the component P is very small. In this case also, it is possible to detect that the component P is in a nonconforming suction state by detecting a tilted portion with respect to the level (refer to the portion indicated by a sign L1 in FIG. 6(b)) in part of the lower edge L of the image DP of the component P.

In the component placement apparatus 1 according to this embodiment, as described earlier, the optical axis 20 of the inspection light of the line sensor camera 23 crosses the travel orbit B of the mounting head 7 at an angle θ satisfying 0°<θ≤45° in plan view. The optical axis 20 of the inspection light of the line sensor camera 23 and the travel orbit B of the mounting head 7 are not orthogonal to each other in plan view. The image DP of each of a plurality of components P sucked to each of a plurality of suction nozzles 9 of the mounting head 7 is obtained as an independent image not overlapping with the images DP of other components P. Assume a case where eight components P1, P2, ..., P8 are sucked to eight suction nozzles 9 shown in FIG. 8(a). When the mounting head 7 moves on the travel orbit B in the order of FIG. 8(a) to FIG. 8(e), the eight components P1 to P8 cross the inspection light in the order of P1, P2, ..., P4, P5, ..., P8 and are imaged in this order by the line sensor camera 23. The images obtained in the direction of time T are shown in FIG. 9.

In FIG. 9, the image of a suction nozzle 9 is represented by a sign D9 and the images of components P1 to P8 by signs DP1 to DP8. The suction attitude of the component P4 is nonconforming in the example of FIG. 9. This is detected by applying the aforementioned approach for determining the propriety of suction attitude of a component P by determining whether the height H of the image DP of the component P is above a predetermined reference value H0 and whether the lower edge L of the image DP of the component P includes a tilted portion with respect to the level.

In the component placement apparatus 1 according to this embodiment, the mounting head 7 is moved to allow a component sucked to the suction nozzle 9 of the mounting head 7 before being mounted onto the substrate 10 to cross the optical axis 20 of the inspection light of the line sensor camera 23 at an angle $\theta$ satisfying $0°<\theta\leq 45°$ in plan view to perform imaging of the component P. This relatively reduces the moving speed of a component P viewed from the line sensor and increases the number of measurements of images DP of a component P obtained by way of the line sensor camera 23 thus accurately determining the outer shape of the component P, compared with related art practices where a component P crosses the optical axis 20 of inspection light in orthogonal (or almost orthogonal) direction in plan view. It is thus possible to accurately determine the propriety of suction attitude of the component P with respect to the suction nozzle 9 while reducing the moving speed of the mounting head and without increasing the mounting takt time.

In the component placement apparatus 1 according to this embodiment, the projector 21 and the line sensor 22 constituting the line sensor camera 23 are arranged outside the movable region R of the mounting head 7 with respect to the base 2. There is no danger of interference between the mounting head 7 and the line sensor camera 23 (the projector 21 and the line sensor 22) so that the mounting head 7 is free to move within the movable region R. This improves the mounting takt time compared with related art practices where the line sensor camera 23 is provided in close proximity to the component camera 18 (within the movable region R of the mounting head 7).

After the component P is mounted on the substrate 10 by the mounting head 7, there may occur an error that the mounting head 7 has failed to mount the component P onto the substrate 10 and the component P remains sucked to the suction nozzle 9, so-called non-mounting of a component. To detect such non-mounting of a component (presence of a non-mounted component), all suction nozzles 9 should be imaged following the step of mounting a component P onto the substrate 10 while the suction nozzles are crossing the inspection light of the line sensor camera 23 before a next component P is picked up, thus detecting whether a component P remains sucked to any suction nozzle 9.

In the component placement apparatus 1 according to this embodiment, the projector 21 and the line sensor 22 constituting the line sensor camera 23 are arranged outside the movable region R of the mounting head 7 with respect to the base 2 without danger of interference with the mounting head 7 rather than in close proximity to the component camera 18 as in the related art. In the procedure for detecting presence of a non-mounted component, the mounting head 7 need not move on the same travel orbit B used to detect the propriety of suction attitude of a component P, but may move on a free path including a path orthogonal to the travel orbit B. This improves the mounting takt time with this respect. In case non-mounting of a component is detected, which suction nozzle 9 holds the non-mounted component sucked thereto must be detected anew. In that case, the mounting head 7 has only to move on the travel orbit B followed by imaging of individual components P by the line sensor 23. In this case, similar to determination of the propriety of suction attitude, imaging of an individual component P may be executed while the mounting head 7 is moved only once along the travel orbit B.

The component placement apparatus 1 according to this embodiment determines whether the height H of the image DP of a component P is above a predetermined reference value H0 and whether the lower edge L of the image DP includes a tilted portion with respect to the level based on the image DP of the component P obtained through imaging of the component P by the line sensor camera 23 and determines the propriety of suction attitude of the component P with respect to the suction nozzle 9 based on the result of the above determination. It is thus possible to accurately detect the nonconformity of a suction attitude not detected so far through comparison of the height of the image DP of a component P with a reference value H0 and accurately determine the propriety of suction attitude of a very small component P.

It is not always necessary to make both of the determinations, that is, whether the height H of the image DP of a component P is above a predetermined reference value H0 and whether the lower edge L of the image DP of a component P includes a tilted portion with respect to the level. In case the height H of the image DP of a component P is above a predetermined reference value H0, the suction attitude of the component P is proven nonconforming without checking for a tilted portion. Thus, determination on whether the lower edge L of the image DP of a component P includes a tilted portion with respect to the level may be skipped in case it is determined that the height H of the image DP of a component P is above a predetermined reference value H0 as a result of determination on whether height H of the image DP of a component P is above a predetermined reference value H0. This boosts the processing speed and improves the mounting takt time.

With the component placement apparatus 1 according to this embodiment, in case an insertion mounting component Pa including a plurality of leads S inserted and mounted into a substrate 10 shown in FIG. 10 is used, it is possible to determine the propriety of suction attitude of the component Pa with respect to the suction nozzle 9 as well as determine the presence of deformation of the lead S. Such a component has a small surface area at the tip (lower part Sa) of the lead S, which makes it difficult to correctly locate the tip of the lead S through image recognition from beneath. With the component placement apparatus 1 according to this embodiment, an easy check is made for deformation of the lead S as described below.

In case the mounting head 7 with an insertion mounting component Pa shown in FIG. 10 sucked to the suction nozzle 9 is moved on the travel orbit B and the component Pa is imaged by the line sensor camera 23, the image DP obtained looks like one in FIG. 11. The controller 16 as determination means determines that the suction attitude is conforming only in case the height of the lower end DSp of the image DSa of the lower part Sa of each lead S of the component Pa (refer to FIG. 10) is the same, and determines that the suction attitude is nonconforming otherwise.

The controller 16 determines that the lead S of the component Pa is not deformed in case the width ΔDSa of the image DSa of the lower part Sa of each lead S, the width ΔDSb of the image DSb of the upper part Sb (refer to FIG. 10) of each lead S, the spacing Δda between the images DSa of the lower parts Sa of adjacent leads S, and the spacing Δdb between the images DSb of the upper parts Sb of adjacent leads S are respectively constant. The controller 16 determines that the lead S of the component Pa is deformed in case ΔDSa, ΔDSb, Δda and Δdb are not respectively constant. Note that the spacing Δda1, Δdb1 between the leads S arranged on both sides of the component Pa is excluded from a target of determination.

This reliably rejects an insertion mounting component Pa having a conforming suction attitude with respect to the suction nozzle 9 that cannot be mounted onto the substrate 10 due to deformation of the lead S.

Note that only the lower part Sa of a lead S is inserted into an insertion hole in the substrate 10. While it appears that ΔDSb and Δdb need not be determined constant respectively with this respect, determination on whether ΔDSb and Δdb are respectively constant provides for a case where the lower part Sa of a lead S is in normal position although the middle part of the lead S is deformed.

Imaging is made, after recognizing by the component camera 18 a deviation of a component P in the direction around the vertical axis of the suction nozzle 9, while the mounting head 7 is being moved along the travel orbit B with a short side of the component Pa aligned to the optical axis 20 of the inspection light of the line sensor camera 23 and with the rotational attitude of the component Pa around the vertical axis of the suction nozzle 9 adjusted based on the deviation. Further imaging is made while the mounting head 7 is being moved along the travel orbit B with a long side of the component Pa aligned to the optical axis 20 of the inspection light of the line sensor camera 23. This determines any deformation of the lead S more correctly.

Industrial Applicability

The invention prevents free operation of a mounting head within the movable region from being restricted and improves the mounting takt time.

The invention correctly determines the propriety of suction attitude of a very small component with respect to a suction nozzle.

The invention accurately determines the propriety of suction attitude of a component with respect to a suction nozzle without increasing the mounting takt time.

The invention claimed is:

1. A component placement apparatus for moving a mounting head comprising nozzle lines arranged in parallel with each other with respect to a base comprising a substrate transfer path, each of the nozzle lines comprising a plurality of suction nozzles arranged along the substrate transfer path, and for mounting, onto a substrate movably positioned on the substrate transfer path of the base, components sucked to the suction nozzles of the mounting head, said component placement apparatus comprising:

a component camera that has an imaging surface facing up and obtains an image of a lower surface of the component sucked to the suction nozzle which passes above the component camera;

a line sensor camera comprising a projector for projecting inspection light in horizontal direction and a line sensor for receiving the inspection light projected by the projector;

imaging control means for moving the mounting head to allow a component sucked to the suction nozzle of the mounting head before being mounted onto the substrate to horizontally cross the optical axis of the inspection light of the line sensor camera to cause the line sensor camera to perform imaging of the component; and a controller which determines the propriety of suction attitude of the component with respect to the suction nozzle based on the image of the component obtained through imaging of the component by the line sensor camera, and also determines a positional displacement of the component from the corresponding suction nozzle based on the image obtained by the component camera;

wherein the projector and the line sensor constituting the line sensor camera are arranged outside the movable region of the mounting head with respect to the base and arranged such that the optical axis of the inspection light crosses a travel orbit of the nozzle line of the mounting head at an angle θ, satisfying 0°<θ≤45° in plan view when the mounting head moves above the component camera and on the travel orbit which is parallel to the substrate transfer pass, and wherein the angle θ is an angle between the optical axis of the inspection light and the travel orbit of the nozzle line.

2. The component placement apparatus as claimed in claim 1, wherein said controller determines whether the height of the image of a component is above a reference value and whether the lower edge of the image of the component includes a tilted portion with respect to the level based on the image of the component obtained through imaging of the component by way of said line sensor camera and determines the propriety of suction attitude of the component with respect to the suction nozzle based on the result of the above determination.

3. The component placement apparatus as claimed in claim 1, wherein said imaging control means moves the mounting head to allow a component sucked to the suction nozzle of the mounting head before being mounted onto the substrate to horizontally cross the optical axis of the inspection light of the line sensor camera.

4. The component placement apparatus as claimed in claim 1, wherein the component is an insertion mounting component including a plurality of leads inserted and mounted into a substrate and that the controller determines whether deformation of a lead of the component is present based on the image of the component obtained through imaging of the component by the line sensor camera.

5. The component placement apparatus as claimed in claim 4, wherein the controller determines the deformation of the lead of the component as not present when the controller determines that widths of images of a lower part of each lead, widths of images of an upper part of each lead, spacing between the images of the lower parts of adjacent leads, and spacing between the images of the upper parts of adjacent leads are respectively constant.

6. A component placement apparatus for moving a mounting head comprising a substrate camera that performs image recognition of a substrate having an imaging surface facing down and nozzle lines arranged in parallel with each other with respect to a base comprising a substrate transfer path, each of the nozzle lines comprising a plurality of suction nozzles, each of the suction nozzles being individually rotatable around a vertical axis which is perpendicular to the base, arranged along the substrate transfer path, and for mounting, onto a substrate movably positioned on the substrate transfer path of the base, components sucked to the suction nozzles of the mounting head, said component placement apparatus comprising:

a line sensor camera comprising a projector for projecting inspection light in horizontal direction and a line sensor for receiving the inspection light projected by the projector;

imaging control means for moving the mounting head to allow a component sucked to the suction nozzle of the mounting head before being mounted onto the substrate to horizontally cross the optical axis of the inspection light of the line sensor camera to cause the line sensor camera to perform imaging of the component; and a controller which determines the propriety of suction attitude of the component with respect to the suction nozzle based on the image of the component obtained through imaging of the component by the line sensor camera;

wherein the projector and the line sensor constituting the line sensor camera are arranged outside the movable region of the mounting head with respect to the base and arranged such that the optical axis of the inspection light crosses a travel orbit of the nozzle line of the mounting head at an angle $\theta$, satisfying $0°<\theta\leq 45°$ in plan view when the mounting head moves on the travel orbit which is parallel to the substrate transfer pass, and wherein the angle $\theta$ is an angle between the optical axis of the inspection light and the travel orbit of the nozzle line.

7. The component placement apparatus as claimed in claim 1, wherein all the suction nozzles are configured to cross the inspection light of the line sensor camera to detect a non-mounted component that remains being sucked in any of the suction nozzles by imaging the non-mounted component after the mounting head mounts the components onto the substrate.

8. The component placement apparatus as claimed in claim 1, wherein all the suction nozzles are configured to move on the travel orbit of the nozzle line of the mounting head after the mounting head mounts the components onto the substrate.

9. The component placement apparatus as claimed in claim 1, wherein all the suction nozzles are configured to move on a second travel orbit that is different from the travel orbit of the nozzle line of the mounting head after the mounting head mounts the components onto the substrate.

10. The component placement apparatus as claimed in claim 1, wherein all the suction nozzles are configured to move on a third travel orbit that is perpendicular to the travel orbit of the nozzle line of the mounting head after the mounting head mounts the components onto the substrate.

11. The component placement apparatus as claimed in claim 7, wherein the controller is configured to detect whether any suction nozzle sucks the non-mounted component after the mounting head mounts the components onto the substrate.

* * * * *